(12) United States Patent
Zhang et al.

(10) Patent No.: US 7,990,201 B2
(45) Date of Patent: Aug. 2, 2011

(54) CONSTANT PHASE DIGITAL ATTENUATOR WITH ON-CHIP MATCHING CIRCUITRY

(75) Inventors: Wen Hui Zhang, Nashua, NH (US); Christopher Weigand, Andover, MA (US)

(73) Assignee: M/A-COM Technology Solutions Holdings Inc., Lowell, MA (US)

( * ) Notice: Subject to any disclaimer, the term of this patent is extended or adjusted under 35 U.S.C. 154(b) by 0 days.

(21) Appl. No.: 12/725,533

(22) Filed: Mar. 17, 2010

(65) Prior Publication Data

US 2010/0171541 A1    Jul. 8, 2010

Related U.S. Application Data

(63) Continuation of application No. PCT/US2008/010854, filed on Sep. 18, 2008, which is a continuation of application No. 11/859,130, filed on Sep. 21, 2007, now abandoned.

(51) Int. Cl.
*H03L 5/00* (2006.01)

(52) U.S. Cl. ...................... 327/308; 333/81 R

(58) Field of Classification Search .......... 327/534–537, 327/552–559, 308, 306; 333/81 R
See application file for complete search history.

(56) References Cited

U.S. PATENT DOCUMENTS

| | | | |
|---|---|---|---|
| 4,837,530 A | 6/1989 | Kondoh | |
| 4,978,932 A * | 12/1990 | Gupta et al. | 333/81 R |
| 5,157,323 A * | 10/1992 | Ali et al. | 323/369 |
| 5,281,928 A | 1/1994 | Ravid et al. | |
| 5,309,048 A | 5/1994 | Khabbaz | |
| 5,349,312 A | 9/1994 | Huettner et al. | |
| 5,920,187 A | 7/1999 | Cosgrove et al. | |
| 6,489,856 B1 * | 12/2002 | Weigand | 333/81 R |
| 7,649,430 B2 * | 1/2010 | Takeuchi et al. | 333/104 |

OTHER PUBLICATIONS

Zeeley, C.A., et al., "A J-band Tranceiver MMIC with image rejection," DERA, Malvern, Worcestershire, United Kingdom, Bell Laboratories, Lucent Technologies, Swindon, UK.

* cited by examiner

*Primary Examiner* — Dinh T. Le

(74) *Attorney, Agent, or Firm* — Christopher P. Maiorana, PC

(57) ABSTRACT

Various embodiments are directed to providing constant phase digital attenuation. In one embodiment, a digital attenuator circuit (100) comprises an input node (102) to receive an input signal to be attenuated, an output node (104) to output an attenuated signal, a reference loss path (106) between the input node (102) and the output node (104), and an attenuation path (108) between the input node (102) and the output node (104). The reference loss path (106) comprises switching elements and matching circuitry to improve Voltage Standing Wave Ratio (VSWR), and the attenuation path (108) comprises switching elements and attenuating circuitry to attenuate the input signal when the digital attenuator circuit (100) is switched from a reference loss state to an attenuation state. An effective phase length of the reference loss path (106) and an effective phase length of the attenuation path (108) may be equalized to provide a constant phase when the digital attenuator circuit (100) is switched between states.

18 Claims, 3 Drawing Sheets

CONSTANT PHASE DIGITAL ATTENUATOR WITH ON-CHIP MATCHING CIRCUITRY

The present application is a continuation of PCT Appl. No. PCT/US2008/010854 filed Sep. 18, 2008 filed under 35 USC 111(a) which is a continuation of U.S. application Ser. No. 11/859,130 filed on Sep. 21, 2007 now abandoned, both applications of which are incorporated by reference herein in their entirety.

BACKGROUND

Electronic devices often incorporate controllable attenuation devices and/or components for varying the amount of resistance applied to electronic signals such as radio frequency (RF) signals. Such attenuators are used in, among other things, automatic gain control circuits, position locating systems, telephone systems, television systems, and microwave circuit applications.

Some controllable attenuation devices such as monolithic microwave integrated circuit (MMIC) digital attenuators incorporate high frequency field effect transistors (FETs), such as gallium arsenide (GaAs) metal semiconductor FETs, arranged in a variety of network configurations (which may include other circuit elements, e.g., discrete resistor, among others). These devices operate by turning certain transistors on and off to adjust or select the desired attenuation.

Digital attenuators vary the strength of input signals in response to digital control signals. In a typical 1-bit digital attenuator, the amount of attenuation offered by the attenuator varies depending on whether the bit of the control signal has a value of "0" (logic low) or "1" (logic high). Typically, if a 2-bit or other multiple-bit digital attenuator is desired, a plurality of 1-bit digital attenuators are cascaded according to known techniques to produce the desired m-bit digital attenuator (where m≧2). For example, if a 3-bit digital attenuator is desired, three of the 1-bit digital attenuators are cascaded to produce the 3-bit digital attenuator.

Due to the cascading of bits, however, a reference insertion loss in conventional multi-bit digital attenuators tends to be high resulting in higher Voltage Standing Wave Ratio (VSWR), which represents the amount of reflected power. A high VSWR increases noise, which degrades system performance. Further, having multiple bits that are cascaded in the digital attenuator deteriorates the attenuation accuracy when multiple bits are switched on at the same time.

For certain applications, it is desirable to have a constant phase over attenuation states. Usually, for lower bits and at lower frequencies, phase shift may be less and manageable using techniques such as cascading lower bits. At higher frequencies, however, conventional digital attenuators may experience significant phase difference between the on and off states.

Accordingly, there exists the need for an improved digital attenuator to provide constant phase at higher frequencies.

SUMMARY

The solution is provided by a digital attenuator circuit that comprises an input node to receive an input signal to be attenuated, an output node to output an attenuated signal, a reference loss path between the input node and the output node, and an attenuation path between the input node and the output node. The reference loss path comprises switching elements and matching circuitry to improve Voltage Standing Wave Ratio (VSWR), and the attenuation path comprises switching elements and attenuating circuitry to attenuate the input signal when the digital attenuator circuit is switched from a reference loss state to an attenuation state. An effective phase length of the reference loss path and an effective phase length of the attenuation path may be equalized to provide a constant phase when the digital attenuator circuit is switched between states.

The solution is also provided by a multi-stage digital attenuator that includes a plurality of digital attenuator circuits with each digital attenuator circuit comprising a stage of the multi-stage digital attenuator circuit. The multi-stage digital attenuator includes a plurality of interstage inductance elements implemented as high impedance transmission lines to match the output of a previous stage and the input of a next stage. The plurality of digital attenuator circuits forming the multi-stage digital attenuator may be implemented on a single chip.

The solution also provides a method of providing a digital attenuator circuit on a chip. The digital attenuator circuit includes a reference loss path comprising switching elements and matching circuitry to improve VSWR and an attenuation path comprising switching elements and attenuating circuitry to attenuate an input signal when the digital attenuator circuit is switched from a reference loss state to an attenuation state. An effective phase length of the reference loss path and an effective phase length of the attenuation path may be equalized to provide a constant phase when the digital attenuator circuit is switched between states. A plurality of digital attenuator circuits may be provided on the chip to implement a multi-stage digital attenuator, and interstage inductance elements comprising high impedance transmission lines may be provided to couple digital attenuator circuits.

BRIEF DESCRIPTION OF THE DRAWINGS

The invention will now be described by way of example with reference to the accompanying drawings in which.

DETAILED DESCRIPTION

Figure 1:
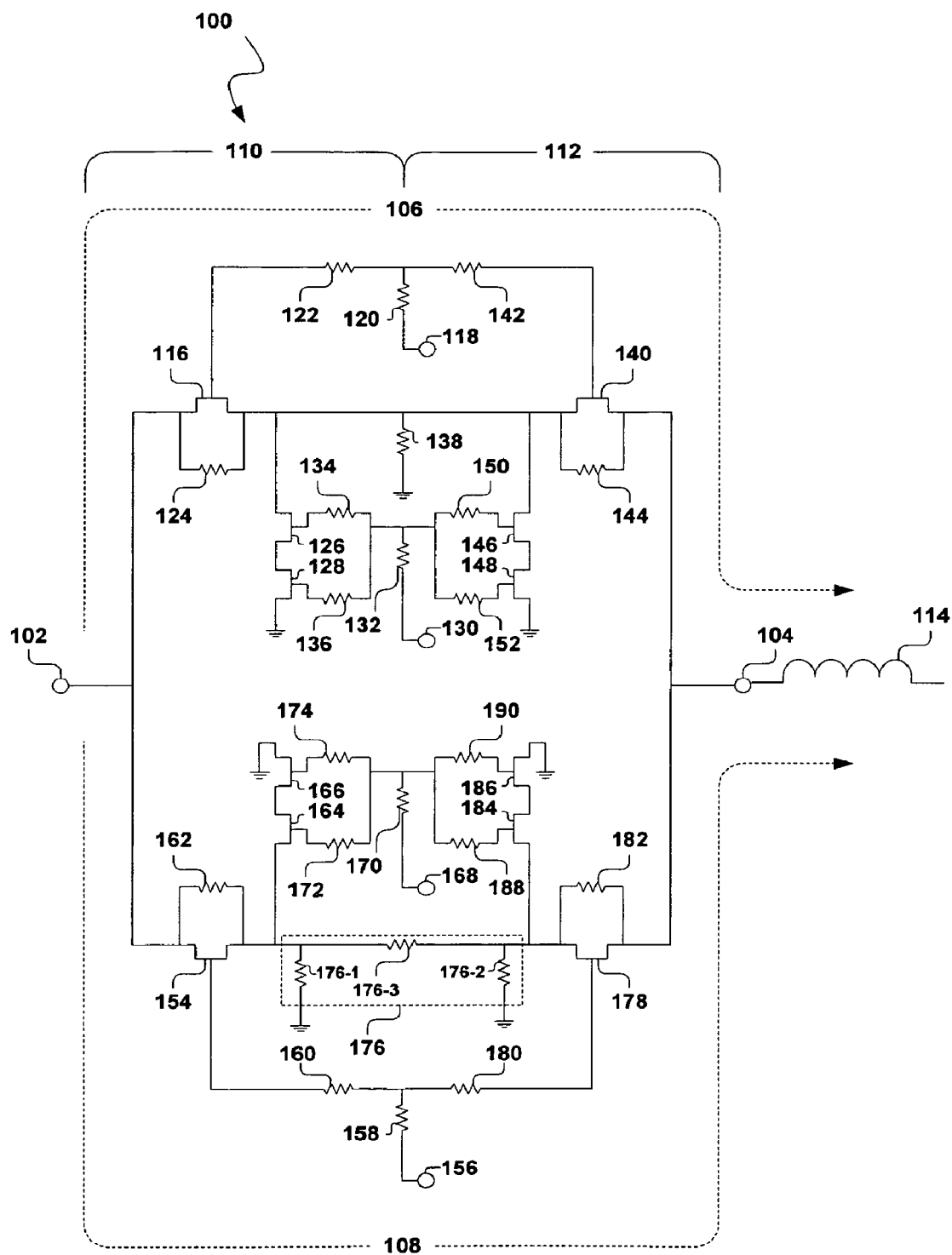
FIG. 1 illustrates one embodiment of a constant phase digital attenuator circuit.

FIG. 1 illustrates one embodiment of a constant phase digital attenuator circuit 100. Digital attenuator circuit 100 comprises RF input node 102 and RF output node 104. While it can be appreciated that digital attenuator circuit 100 comprises a symmetrical structure, it will be assumed for purposes of illustration that the left node comprises RF input node 102 and right node comprises RF output node 104. The embodiments, however, are not limited in this regard.

Each of RF input node 102 and RF output node 104 is connected to reference loss path 106 and attenuation path 108. Digital attenuator circuit 100 may control the switching between reference loss path 106 and attenuation path 108 to achieve a desired amount of attenuation. In various embodiments, the desired amount of attenuation or loss corresponds to a difference in attenuation between reference loss path 106 and attenuation path 108. Although it is desirable for reference loss path 106 to have very low insertion loss, zero insertion loss generally is not attainable. Because reference loss path 106 will always have some insertion loss, the actual amount of attenuation or loss (e.g., 1 dB, 2 dB, 4 dB, 8 dB, 16 dB) provided by digital attenuator circuit 100 is achieved by virtue of the difference in attenuation between reference loss path 106 and attenuation path 108.

As shown in FIG. 1, digital attenuator circuit 100 may implement a double pole double throw (DPDT) switching structure. Namely, input (e.g., left) side 110 and output (e.g., right) side 112 of digital attenuator circuit 100 together may form a DPDT switch. The top and bottom portions of input side 110 form a first single pole double throw (SPDT) switch. For example, at the input node 102, a signal may be switched to either reference path 106 or to attenuation path 108. Likewise, the top and bottom portions of output side 112 form a second SPDT switch. Accordingly, a DPDT switch is implemented by input side 110 and output side 112 of digital attenuator circuit 100.

Digital attenuator circuit 100 is designed such that reference path 106 and attenuation path 108 are switched by the DPDT switching structure. It can be appreciated that there are trade-offs in designing such a switching structure. In particular, digital attenuator circuit 100 must be designed to provide attenuation accuracy, phase balance, low insertion loss, and good VSWR. In addition, low VSWR must be maintained both for individual bits and for combinations of bits. In an exemplary embodiment, each switched element pair (reference loss path 106 and attenuation path 108) is designed to have 50 ohm (Ω) impedance to minimize impedance differences as bits are switched in and out.

In various embodiments, digital attenuator circuit 100 is designed such that the phase length between reference loss path 106 and attenuation path 108 is equal. It is noted that having different effective path lengths for reference loss path 106 and attenuation path 108 may result in significant phase difference between the reference loss and attenuation states at higher frequencies. Because the effective phase lengths of reference loss path 106 and attenuation path 108 are equal, the phase length through the digital attenuator circuit 100 does not change when switching between states. For example, if the insertion phase of the attenuator is 17 degrees in the reference loss state, the phase length will be 17 degrees in the attenuation state for 8 dB attenuation. It is noted that the absolute value of the phase does not matter so long as it is equivalent through reference loss path 106 and attenuation path 108.

In various implementations, digital attenuator circuit 100 comprises a single stage to be cascaded with one or more other stages. In such implementations, excess shunt capacitance may exist at the common junctions of the DPDT switches, which will affect the phase accuracy when cascaded. Each stage having poor VSWR may exhibit reflections. While small reflections may have minimal affect on attenuation accuracy, even small reflections must be minimized to avoid creating phase errors. By eliminating reflections, good VSWR is achieved and phase accuracy is maintained for higher frequencies. This is especially important for higher frequencies such as 4 GHz.

As shown in FIG. 1, digital attenuator circuit 100 comprises interstage inductance element 114. Interstage inductance element 114 may be implemented at the common junction (e.g., RF output node 104) of cascaded DPDT switches. In various embodiments, interstage inductance element 114 may be used to couple stages or bits as well as to couple a stage or bit to the output or to the input.

Interstage inductance element 114 may be designed to match out the parasitic reactance (e.g. excess shunt capacitance) between stages or bits at higher frequencies and minimize reflections. For example, the inductance provided by interstage inductance element 114 may be used to match the output of a previous stage and the input of the next stage. In an exemplary embodiment, interstage inductance element 114 may provide an inductance of 0.8 nH between stages.

In various embodiments, interstage inductance element 114 may comprise a high impedance transmission line. In such embodiments, the high impedance transmission line may have a higher Q factor and lower insertion loss as compared to a standard spiral inductor. Accordingly, use of interstage inductance 114 may achieve wideband constant phase digital attenuation with low insertion loss.

Interstage inductance element 114 (e.g., high impedance transmission line) also may be designed to maximize separation between stages to minimize coupling between stages. By avoiding coupling between stages or bits, phase interaction with the actual attenuator bits is minimized.

In the embodiment of FIG. 1, digital attenuator circuit 100 is designed such that the effective phase lengths between reference loss path 106 and attenuation path 108 are equal. As shown, reference loss path 106 and attenuation path 108 of digital attenuator circuit 100 may be implemented by a network configuration of transistors and resistors. Each transistor may comprise, for example, a field effect transistor (FET) such as a junction FET (JFET), a metal-oxide semiconductor FET (MOSFET), a metal semiconductor FET (MESFET), a pseudomorphic high electron mobility transistor (PHEMT), or other type of suitable transistor in accordance with the described embodiments. The transistors may comprise various n-type or p-type semiconductor materials such as silicon, GaAs, and so forth. Each resistor may comprise, for example, a thin-film resistor or other suitable resistor in accordance with the described embodiments.

Reference path 106 between input node 102 and output node 104 comprises first series FET 116. The gate of first series FET 116 may be connected to biasing node 118 through resistor 120 and resistor 122. The source and drain of first series FET 116 may be connected to resistor 124. In one exemplary embodiment, resistor 120 may comprise a 2 Ω resistor, resistor 122 may comprise a 10 kΩ resistor, and resistor 124 may comprise a 10 Ω resistor.

First series FET 116 is connected to cascaded first shunt FET 126 and second shunt FET 128, which is connected to ground. The gate of first shunt FET 126 may be connected to biasing node 130 through resistor 132 and resistor 134. The gate of second shunt FET 128 may be connected to biasing node 130 through resistor 132 and resistor 136. In one exemplary embodiment, resistor 132 may comprise a 2 kΩ resistor, resistor 134 may comprise a 10 kΩ resistor, and resistor 136 may comprise a 10 kΩ resistor. In another embodiment, cascaded first shunt FET 126 and second shunt FET 128 may be replaced by a single dual gate shunt FET.

First series FET 116 is also connected to shunt resistor 138 which is connected to ground. In various embodiments, shunt resistor 138 is designed to keep the VSWR on the reference path 106 as good (e.g., low) as possible and to minimize reflections. In one exemplary embodiment, shunt resistor 138 may comprise a 2011Ω resistor.

Reference path 106 comprises second series FET 140 connected to shunt resistor 138. The gate of second series FET 140 may be connected to biasing node 118 through resistor 120 and resistor 142. The source and drain of second series FET 140 may be connected to resistor 144. In one exemplary embodiment, resistor 120 may comprise a 2 kΩ resistor, resistor 142 may comprise a 10 kΩ resistor, and resistor 144 may comprise a 10 kΩ resistor.

Second series FET 140 is connected to cascaded third shunt FET 146 and fourth shunt FET 148, which is connected to ground. The gate of third shunt FET 146 may be connected to biasing node 130 through resistor 132 and resistor 150. The gate of fourth shunt FET 148 may be connected to biasing node 130 through resistor 132 and resistor 152. In one exemplary embodiment, resistor 132 may comprise a 2 kΩ resistor, resistor 150 may comprise a 10 kΩ resistor, and resistor 152 may comprise a 10 kΩ resistor. In another embodiment, cascaded third shunt FET 146 and fourth shunt FET 148 may be replaced by a single dual gate shunt FET.

Attenuation path 108 between input node 102 and output node 104 comprises third series FET 154. The gate of third series FET 154 may be connected to biasing node 156 through resistor 158 and resistor 160. The source and drain of third series FET 154 may be connected to resistor 162. In one exemplary embodiment, resistor 158 may comprise a 2 kΩ resistor, resistor 160 may comprise a 10 kΩ resistor, and resistor 162 may comprise a 10 kΩ resistor.

Third series FET 154 is connected to cascaded fifth shunt FET 164 and sixth shunt FET 166, which is connected to ground. The gate of fifth shunt FET 164 may be connected to biasing node 168 through resistor 170 and resistor 172. The gate of sixth shunt FET 166 may be connected to biasing node 168 through resistor 170 and resistor 174. In one exemplary embodiment, resistor 170 may comprise a 2 kΩ resistor, resistor 172 may comprise a 10 kΩ resistor, and resistor 174 may comprise a 10 kΩ resistor. In another embodiment, cascaded fifth shunt FET 164 and sixth shunt FET 166 may be replaced by a single dual gate shunt FET.

Third series FET 154 is also connected to PI network 176 comprising shunt resistor 176-1 connected to ground, shunt resistor 176-2 connected to ground, and series resistor 176-3 connected to shunt resistor 176-1 and shunt resistor 176-2. In various embodiments, shunt resistor 176-1, shunt resistor 176-2, and series resistor 176-3 are structured and arranged in accordance with the desired amount of attenuation or loss provided by digital attenuator circuit 100.

Attenuation path 108 comprises fourth series FET 178 connected to PI network 176. The gate of fourth series FET 178 may be connected to biasing node 156 through resistor 158 and resistor 180. The source and drain of fourth series FET may be connected to resistor 182. In one exemplary embodiment, resistor 158 may comprise a 2 kΩ resistor, resistor 180 may comprise a 10 kΩ resistor, and resistor 182 may comprise a 10 kΩ resistor.

Fourth series FET 178 is connected to cascaded seventh shunt FET 184 and eighth shunt FET 186, which is connected to ground. The gate of seventh shunt FET 184 may be connected to biasing node 168 through resistor 170 and resistor 188. The gate of eighth shunt FET 186 may be connected to biasing node 168 through resistor 170 and resistor 190. In one exemplary embodiment, resistor 170 may comprise a 2 kΩ resistor, resistor 188 may comprise a 10 kΩ resistor, and resistor 190 may comprise a 10 kΩ resistor. In another embodiment, cascaded seventh shunt FET 184 and eighth shunt FET 186 may be replaced by a single dual gate shunt FET.

In various embodiments, digital attenuator circuit 100 may vary the strength of input signals in response to voltages applied to the biasing nodes which turn on attenuation path 108 and turn off reference loss path 106 and vice versa. In operation, an RF signal applied at RF input node 102 of digital attenuator circuit 100 may be attenuated appropriately to generate an attenuated signal at RF output node 104 by applying voltages to the biasing nodes to turn certain FETs on and off for achieving a desired amount of attenuation or loss. For example, applying an approximately zero bias voltage to the gate of a FET places the FET in a low impedance or on state. Applying a negative bias voltage such as −5 V to the gate of a FET places the FET in a high impedance or off state. It is noted that the negative bias voltage may vary such as from −3 V to −8 V, for example.

When digital attenuator circuit 100 is in the attenuation state, reference loss path 106 is off and attenuation path 108 is on. In references loss path 106, a negative bias voltage (e.g., −5 V) may be applied to biasing node 118 so that first series FET 116 and second series FET 140 are off, and an approximately zero bias voltage may be applied to biasing node 130 so that first shunt FET 126, second shunt FET 128, third shunt FET 146, and fourth shunt FET 148 are on. In attenuation path 108, an approximately zero bias voltage may be applied to biasing node 156 so that third series FET 154 and fourth series FET 178 are on, and a negative bias voltage (e.g., −5 V) may be applied to biasing node 168 so that fifth shunt FET 164, sixth shunt FET 166, seventh shunt FET 184, and eighth shunt FET 186 are off To switch digital attenuator circuit 100 to the reference loss state, opposite biasing voltages may be applied to biasing nodes 118, 130, 156, and 168. When in the reference loss (low attenuation) state, reference loss path 106 is on and attenuation path 108 is off In reference loss path 106, first series FET 116 and second series FET 140 are on, first shunt FET 126, second shunt FET 128, third shunt FET 146, and fourth shunt FET 148 are off, and shunt resistor 138 provides good VSWR. In attenuation path 108, third series FET 154 and fourth series FET 178 are off, and fifth shunt FET 164, sixth shunt FET 166, seventh shunt FET 184, and eighth shunt FET 186 are on.

In one embodiment, digital attenuator circuit 100 may be designed to achieve 1 dB of attenuation. In an exemplary 1 dB circuit, shunt resistor 176-1 may comprise a 637.9 Ω resistor, shunt resistor 176-2 may comprise a 637.9 Ω resistor, and series resistor 176-3 may comprise a 5.0 Ω resistor.

In another embodiment, digital attenuator circuit 100 may be designed to achieve 2 dB of attenuation. In an exemplary 2 dB circuit, shunt resistor 176-1 may comprise a 301.4 Ω resistor, shunt resistor 176-2 may comprise a 301.4 Ω resistor, and series resistor 176-3 may comprise a 9.3 Ω resistor.

In another embodiment, digital attenuator circuit 100 may be designed to achieve 4 dB of attenuation. In an exemplary 4 dB bit circuit, shunt resistor 176-1 may comprise a 171.7 Ω resistor, shunt resistor 176-2 may comprise a 171.7 Ω resistor, and series resistor 176-3 may comprise a 20.8 Ω resistor.

In another embodiment, digital attenuator circuit 100 may be designed to achieve 8 dB of desired attenuation or loss. In an exemplary 8 dB bit circuit, shunt resistor 176-1 may comprise a 98.2 Ω resistor, shunt resistor 176-2 may comprise a 98.2 Ω resistor, and series resistor 176-3 may comprise a 46.4 Ω resistor.

In another embodiment, digital attenuator circuit 100 may be designed to achieve 16 dB of desired attenuation or loss. In an exemplary 16 dB bit circuit, shunt resistor 176-1 may comprise a 56.2 Ω resistor, shunt resistor 176-2 may comprise a 56.2 Ω resistor, and series resistor 176-3 may comprise a 129.2 Ω resistor.

Figure 2:
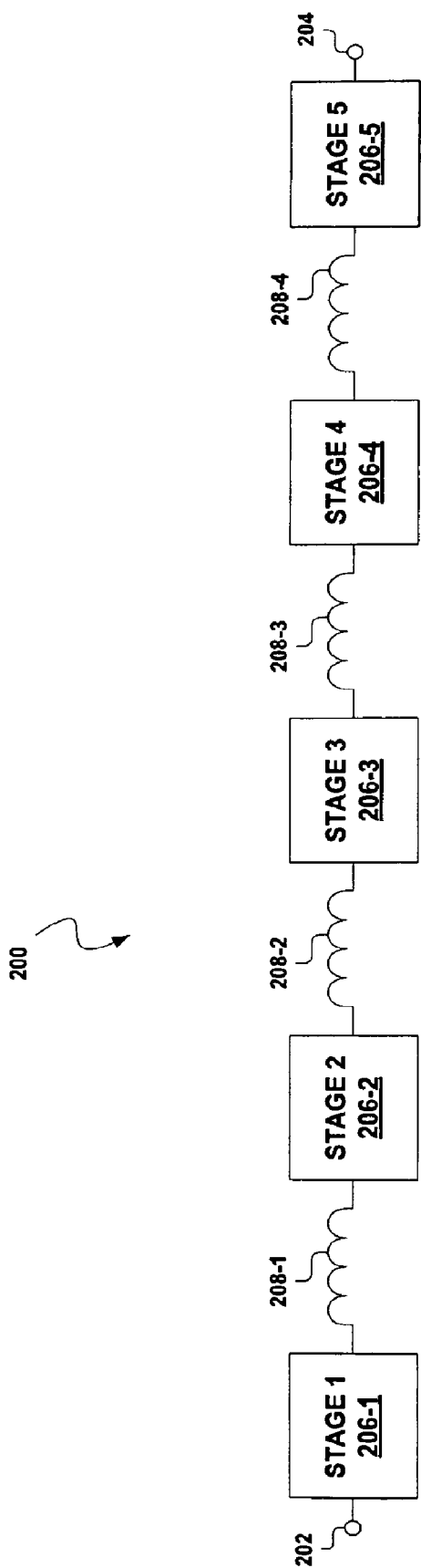
FIG. 2 illustrates one embodiment of a multi-stage constant phase digital attenuator.

FIG. 2 illustrates one embodiment of a multi-stage digital attenuator 200 comprising RF input node 202, RF output node 204, and attenuation stages 206-1 through 206-5. As shown, multi-stage digital attenuator 200 may implement a 5 bits constant digital attenuator. It can be appreciated that multi-stage digital attenuator 200 may comprise or implement a greater or fewer number of stages in accordance with the described embodiments.

In this embodiment, attenuation stage 206-1 is connected to attenuation stage 206-2 via interstage inductance element 208-1 arranged to match the output of attenuation stage 206-1 and the input of the attenuation stage 206-2. Attenuation stage 206-2 is connected to attenuation stage 206-3 via interstage inductance element 208-2 arranged to match the output of attenuation stage 206-2 and the input of the attenuation stage 206-3. Attenuation stage 206-3 is connected to attenuation stage 206-4 via interstage inductance element 208-3 arranged to match the output of attenuation stage 206-3 and the input of the attenuation stage 206-4. Attenuation stage 206-4 is connected to attenuation stage 206-5 via interstage inductance element 208-4 arranged to match the output of attenuation stage 206-4 and the input of the attenuation stage 206-5.

Each of attenuation stages 206-1 through 206-5 may comprise or be implemented by digital attenuator circuit 100 of FIG. 1, and each of interstage inductance elements 208-1 through 208-4 may comprise or be implemented as a high impedance transmission line having a high Q factor and low insertion loss. Interstage inductance elements 208-1 through 208-4 may be designed to match out the parasitic reactance (e.g. excess shunt capacitance) between stages or bits at higher frequencies and minimize reflections. Interstage inductance elements 208-1 through 208-4 also may be designed to maximize separation between stages to minimize coupling between stages. By avoiding coupling between stages or bits, phase interaction with the actual attenuator bits is minimized.

Figure 3:
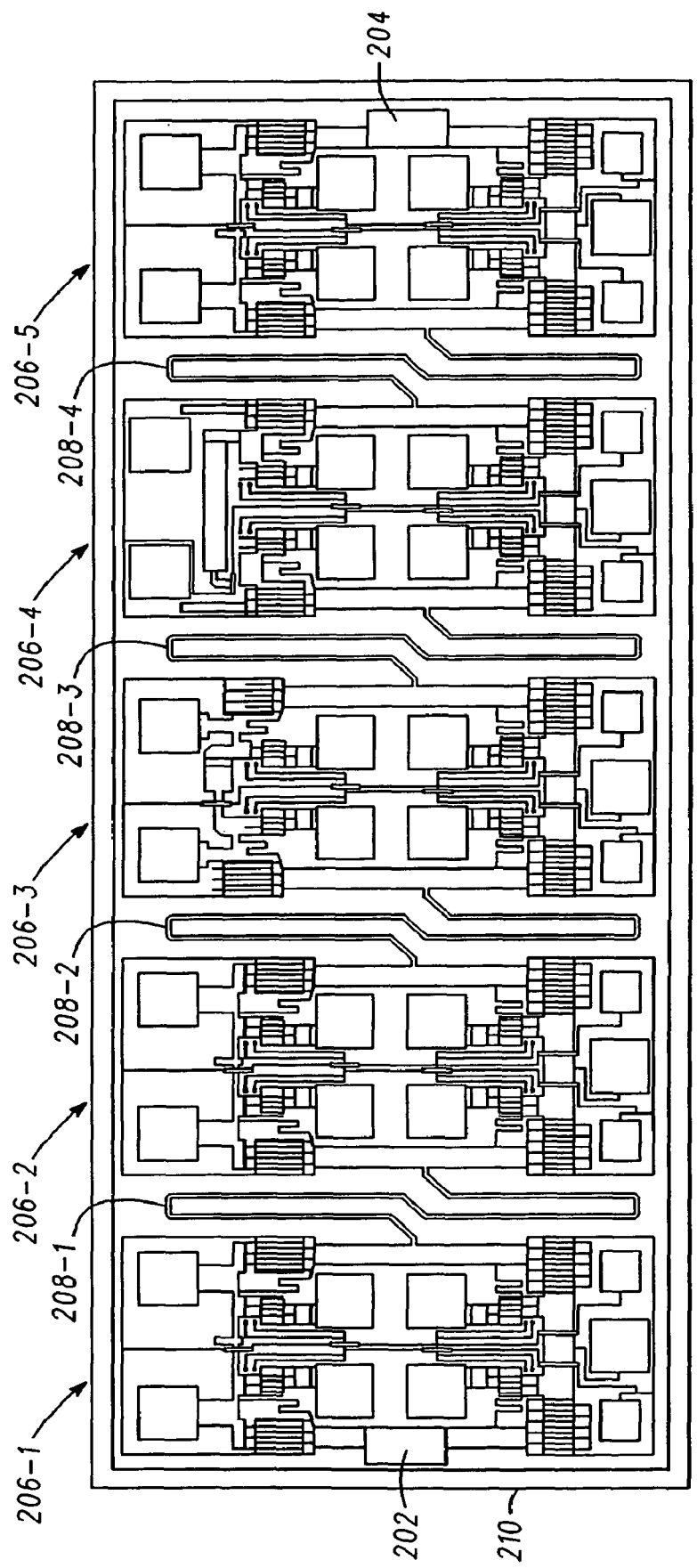
FIG. 3 illustrates an on-chip layout of one embodiment of a multi-stage constant phase digital attenuator.

FIG. 3 illustrates an on-chip layout of one embodiment of multi-stage digital attenuator 200. In this embodiment, multi-stage digital attenuator 200 comprises RF input node 202, RF output node 204, attenuation stages 206-1 through 206-5 and interstage inductance elements 208-1 through 208-4 arranged to match the output and input of attenuation stages. As shown, multi-stage digital attenuator 200 may be implemented on a single chip 210. Accordingly, multi-stage digital attenuator 200 may achieve wideband constant phase digital attenuation with low insertion loss and on-chip matching circuitry.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "various embodiments," "some embodiments," "one embodiment," or "an embodiment" means that a particular feature, structure, or characteristic described in connection with the embodiment is included in at least one embodiment. Thus, appearances of the phrases "in various embodiments," "in some embodiments," "in one embodiment," or "in an embodiment" in places throughout the specification are not necessarily all referring to the same embodiment. Furthermore, the particular features, structures or characteristics may be combined in any suitable manner in one or more embodiments.

While certain features of the embodiments have been illustrated as described above, many modifications, substitutions, changes and equivalents will now occur to those skilled in the art. It is therefore to be understood that the appended claims are intended to cover all such modifications and changes as fall within the true spirit of the embodiments.

The invention claimed is:

1. A digital attenuator circuit comprising:
   an input node to receive an input signal to be attenuated;
   an output node to present an attenuated signal;
   a reference loss path between the input node and the output node comprising (i) a plurality of first series transistors and (ii) a plurality of cascaded shunt transistors each connected to a respective one of the plurality of first series transistors, wherein the input signal is varied in response to (a) a first voltage applied to a first biasing node connected to the plurality of first series transistors and (b) a second voltage applied to a second biasing node connected to the plurality of cascaded shunt transistors to improve Voltage Standing Wave Ratio (VSWR), wherein each of said plurality of cascaded shunt transistors receive said second voltage from said second biasing node; and
   an attenuation path between the input node and the output node comprising a plurality of second series transistors, wherein the input signal is varied in response to a third voltage applied to a third biasing node connected to the plurality of second series transistors to (i) attenuate the input signal when the digital attenuator circuit is switched from a reference loss state to an attenuation state, (ii) equalize an effective phase length of the reference loss path and an effective phase length of the attenuation path and (iii) provide a constant phase when the digital attenuator circuit is switched between states.

2. The digital attenuator circuit of claim 1, further comprising:
   an interstage inductance element connected to at least one of the input node and the output node to match an output of a previous stage and an input of a next stage.

3. The digital attenuator circuit of claim 2, wherein the interstage inductance element comprises a high impedance transmission line.

4. The digital attenuator circuit of claim 1, wherein the reference loss path comprises a shunt resistor connected to each of the plurality of series transistors.

5. The digital attenuator circuit of claim 4, wherein the reference loss path further comprises a dual gate shunt transistor connected to each of the plurality of series transistors.

6. The digital attenuator circuit of claim 1, wherein the attenuation path comprises a PI network connected to each of the plurality of series transistors.

7. The digital attenuator circuit of claim 1, wherein the attenuation path further comprises a plurality of second cascaded shunt transistors each connected to a respective one of the plurality of second series transistors.

8. The digital attenuator circuit of claim 6, wherein the attenuation path further comprises a dual gate shunt transistor connected to each of the plurality of second series transistors.

9. The digital attenuator circuit of claim 6, wherein the PI network is configured in accordance with an amount of attenuation to be provided by the digital attenuator circuit.

10. The digital attenuator circuit of claim 1, wherein said plurality of first series transistors all turn on/off in response to said first biasing node.

11. The digital attenuator circuit of claim 1, wherein said plurality of cascaded shunt transistors all turn on/off in response to said second biasing node.

12. A method comprising:
   providing a digital attenuator circuit on a chip, the digital attenuator circuit comprising:
   a reference loss path comprising (i) a plurality of first series transistors and (ii) a plurality of cascaded shunt transistors each connected to a respective one of the plurality of first series transistors, wherein the input signal is varied in response to (a) a first voltage applied to a first biasing node connected to the plurality of first series transistors and (b) a second voltage applied to a second biasing node connected to the plurality of cascaded shunt transistors to improve Voltage Standing Wave Ratio (VSWR), wherein each of said plurality of cascaded shunt transistors receive said second voltage from said second biasing node; and an attenuation path comprising a plurality of second series transistors, wherein the input signal is varied in response to a third voltage applied to a third biasing node connected to the plurality of second series transistors to (i) attenuate an input signal when the digital attenuator circuit is switched from a reference loss state to an attenuation state, (ii) equalize an effective phase length of the reference loss path and an effective phase length of the attenuation path and (iii) provide a constant phase when the digital attenuator circuit is switched between states.

13. The method of claim 12, further comprising:
providing a plurality of the digital attenuator circuits on the chip to implement a multi-stage digital attenuator.

14. The method of claim 13, further comprising:
providing interstage inductance elements for coupling digital attenuator circuits.

15. The method of claim 14, the interstage inductance elements comprising high impedance transmission lines.

16. The digital attenuator circuit of claim 7, wherein said input signal is varied in response to a fourth voltage applied to a fourth biasing node connected to the plurality of second cascaded shunt transistors.

17. The method of claim 12, wherein the attenuation path further comprises a plurality of second cascaded shunt transistors each connected to a respective one of the plurality of second series transistors.

18. The method of claim 17, wherein said input signal is varied in response to a fourth voltage applied to a fourth biasing node connected to the plurality of second cascaded shunt transistors.

* * * * *